(12) United States Patent
Niu et al.

(10) Patent No.: US 9,318,424 B2
(45) Date of Patent: Apr. 19, 2016

(54) MCSP POWER SEMICONDUCTOR DEVICES AND PREPARATION METHODS THEREOF

(71) Applicant: Alpha and Omega Semiconductor Incorporated, Sunnyvale, CA (US)

(72) Inventors: Zhiqiang Niu, Santa Clara, CA (US); Jun Lu, San Jose, CA (US); Hamza Yilmaz, Saratoga, CA (US); Hongtao Gao, Shanghai (CN)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

(21) Appl. No.: 14/447,956

(22) Filed: Jul. 31, 2014

(65) Prior Publication Data

US 2016/0035653 A1   Feb. 4, 2016

(51) Int. Cl.
  *H01L 23/495* (2006.01)
  *H01L 21/78* (2006.01)
  *H01L 23/00* (2006.01)

(52) U.S. Cl.
  CPC .......... *H01L 23/49562* (2013.01); *H01L 21/78* (2013.01); *H01L 24/05* (2013.01); *H01L 24/13* (2013.01); *H01L 24/81* (2013.01)

(58) Field of Classification Search
  CPC .......... H01L 2224/73265; H01L 2224/32225; H01L 2924/01029; H01L 2924/15311; H01L 2924/0002; H01L 2224/13147; H01L 2924/07802; H01L 21/568; H01L 2224/49109; H01L 23/49827
  See application file for complete search history.

(56) References Cited

U.S. PATENT DOCUMENTS 6,489,007 B2 * 12/2002 Grigg et al. .................. 428/132
2011/0217813 A1 * 9/2011 Wang ............................ 438/113

* cited by examiner

*Primary Examiner* — Roy Potter
*Assistant Examiner* — Paul Patton

(57) ABSTRACT

The present invention discloses the MCSP power semiconductor device and the preparation method thereof. In the present invention method, a metal foil layer is attached to the back of the wafer using a conductive adhesive layer and a composite tape is laminated on the metal foil layer. Thus, individual MCSP power semiconductor devices are separated by cutting the wafer, the conductive adhesive, the metal foil layer and the composite tape along the scribe lines between adjacent semiconductor chips formed on the front of the wafer.

13 Claims, 8 Drawing Sheets

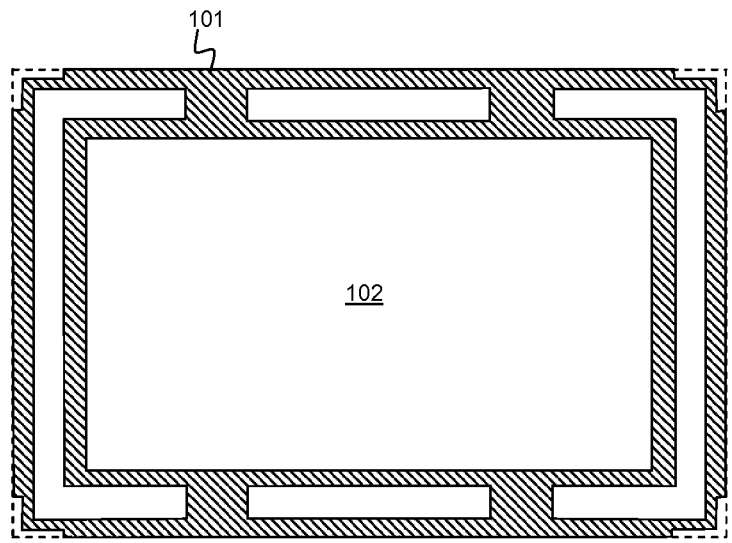
FIG. 1A – Prior Art
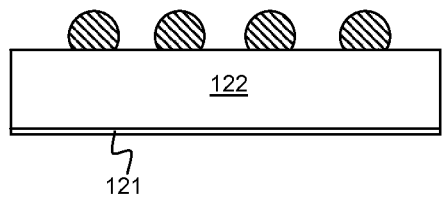
FIG. 1B – Prior Art
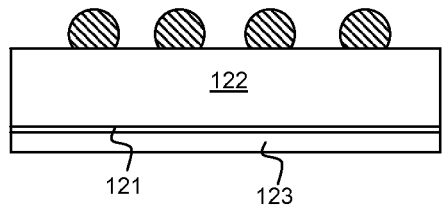
FIG. 1C – Prior Art

MCSP POWER SEMICONDUCTOR DEVICES AND PREPARATION METHODS THEREOF

FIELD OF PRESENT INVENTION

The present invention relates to the power semiconductor devices and more specifically to molded chip-scale package (MCSP) power semiconductor device and the preparation methods thereof.

BACKGROUND OF RELATED ART

Common drain dual MOSFET power devices are mainly used in the management of battery charging and discharging in notebook computers, Tablets or mobile phones. As the recent development is to achieve a shorter charging time, the charge and discharge current needs to increase correspondingly, and the on-resistance of the device needs to be further reduced. In addition, the ultra-thin design of tablets and mobile phones also requires the dimensions of the power devices to be minimized.

FIG. 1A shows a conventional packaging structure for a power MOSFET. In the top view of FIG. 1A, a lead frame 101 is provided and a semiconductor chip 102, with a plurality of solder balls formed on its front, is attached to the lead frame 101, then after curing and molding steps, the front of the packaging layer is ground to expose the solder balls. However, the use of the lead frame 101 increases the manufacturing cost and the thickness of the device. In general the lead frame is required to withstand a high clamping pressure in the molding step; otherwise it may easily be deformed and damaged under higher clamping pressure. Further, for the packaging structure shown in FIG. 1A, the chip 102 is attached on the lead frame 101 using a standard SMT process, thus this package is not a true chip-scale package and the cost is high due to the complicated process.

As shown in cross-sectional view of FIG. 1B, a metal layer 121 is deposited directly on the back of the chip 122 without using a lead frame. However, marking on such exposed metal layer as 121 is more difficult and is easy to wear off, and the metal layer 121 is too thin (in the range of a few microns) to reducing the on-resistance or other types of parasitic resistance of the device. In cross-sectional view of FIG. 1C, a plastic layer 123 is formed on the metal layer 121. In this case, the marking can be done by printing on or etching the plastic layer 123. However, in order to achieve chip scale packaging, polishing and thinning of plastic layer 123 are needed; as such the surface of the ground plastic layer 123 can be a rough surface with pits, which leads to a marking issue.

It is within this context that embodiments of the present invention arise.

BRIEF DESCRIPTION OF THE DRAWINGS

The embodiments of this invention are described in more detail with reference to the accompanying drawings. However, the accompanying drawings are for the purpose of descriptions and illustrations only and do not impose limitation to the scope of the present invention:

FIGS. 1A-1C are schematic diagrams illustrating the semiconductor packages of the background art;

DESCRIPTION OF THE SPECIFIC EMBODIMENTS

Figure 2A:
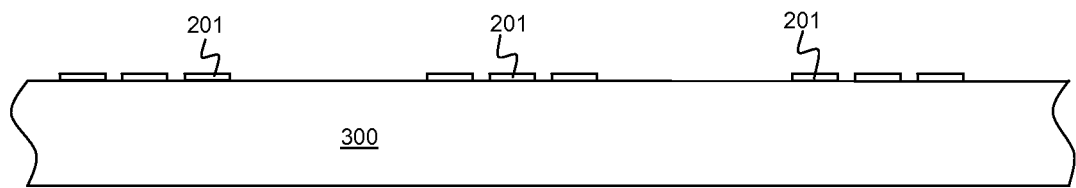
FIGS. 2A-2E are cross-sectional diagrams illustrating the steps of forming the molding layer covering the front of the wafer and thinning the wafer.
Figure 2B:
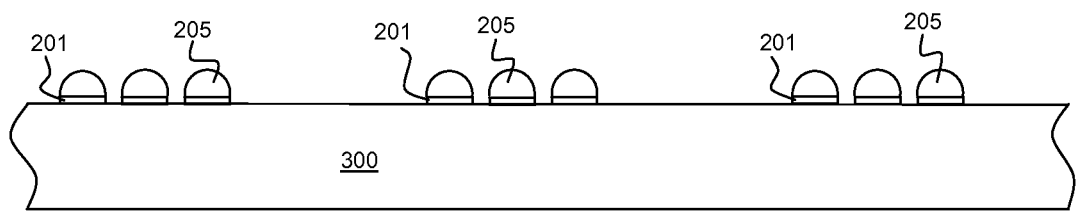
Figure 2C:
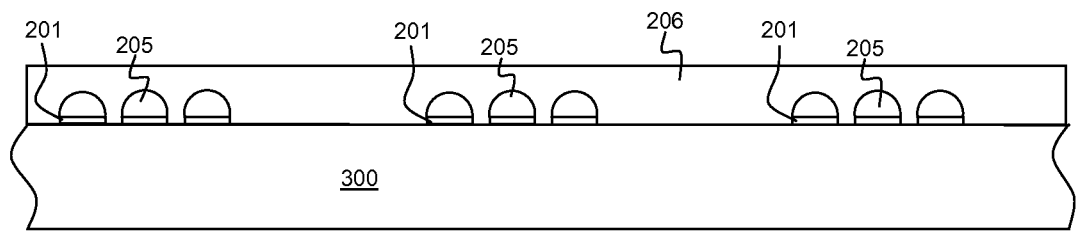
Figure 2D:
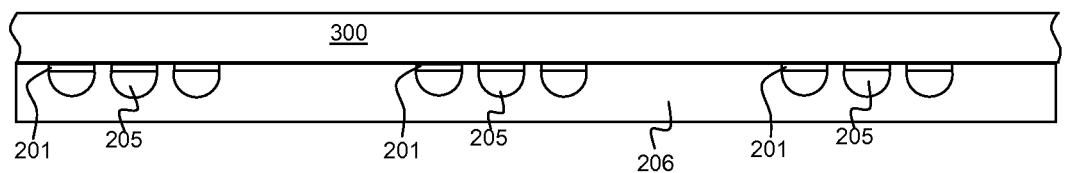
Figure 2E:
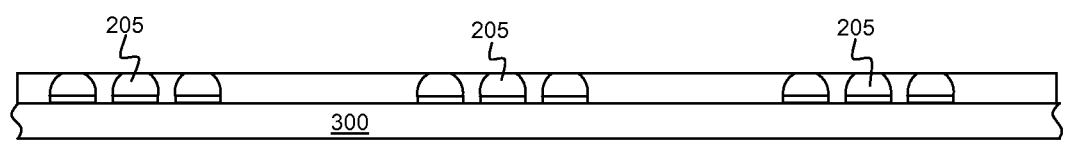

As shown in FIG. 2A, the wafer 300 comprises a plurality of semiconductor chips with the boundaries defined by the horizontal or vertical scribe lines preset on the wafer (not shown) and several conductive pads 201 are formed on the front of each chip functioning as electrode terminals. As shown in FIG. 2B, metal bumps is implanted on the front of the wafer, e.g., a metal bump 205 is deposited on or welded on a corresponding pad 201. The metal bumps 205 can be solder balls, gold bumps and the like. In FIG. 2C, a plastic material such as an epoxy resin is deposited on the front of the wafer 300 forming a molding layer 206 completely encapsulated the metal bumps 205. In FIG. 2D, the wafer 300 is ground from its backside with the mechanical support of the molding layer 206 to reduce its thickness. Optionally, a wet etching can be done on the back of the ground wafer to release the residual stress and repair lattice damage caused by grinding, and then the back side of the wafer 300 is heavily doped by ion implantation forming an ohmic contact with a metal layer (i.e., metal layer 305 shown in FIG. 3A) deposited in subsequent step, for example by sputtering. Subsequently, as shown in FIG. 2E, the molding layer 206 is ground to expose the flat top surfaces of the metal bumps 205.

Figure 3A:
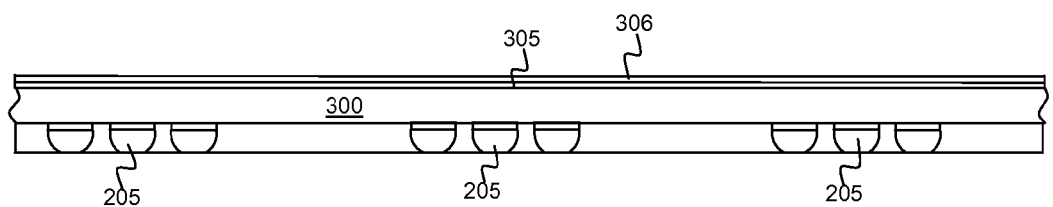
FIGS. 3A-3G are schematic diagrams illustrating a method of forming a MCSP power semiconductor device according to an embodiment of the present invention.
Figure 3B:
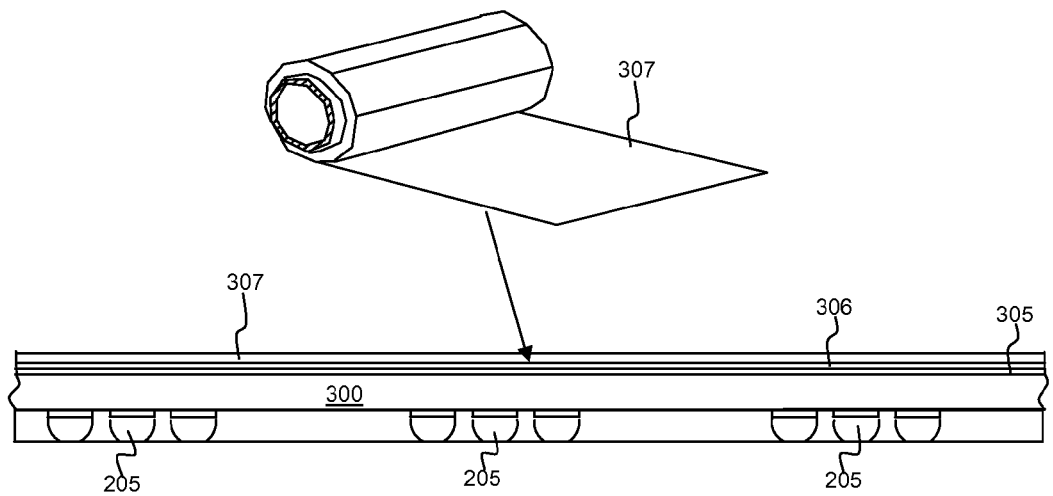

In FIG. 3A, a conductive adhesive layer 306 is formed on the back of thinned wafer 300 over the metal layer 305 (for example, Ti/Ni/Ag or Ti/Ni/Au and the likes). If the conductive adhesive layer 306 is conductive materials, such as solder paste, a conductive paste or the like, the conductive adhesive layer 306 can be directly coated on the metal layer 305 at the back of the thinned wafer. If the conductive adhesive layer 306 is a conductive film with a bonding function, it can be directly attached to metal layer 305 at the back of the thinned wafer 300. In FIG. 3B, a metal foil layer 307 is laminated to the back of the wafer 300 using the conductive adhesive layer 306 for bonding during lamination, so that the metal foil layer 307 is laminated tightly to the metal layer 305 at the back of the wafer 300 to provide an effective increase of the back metal layer thickness evenly across the entire wafer area. Metal foil layer 307 is thick enough to reduce the on-resistance (Rss) of the wafer. A metal foil layer 307 may have a thickness of 0.5-3 mil to maintain its flexibility and integrity. Metal foil layer 307 can be rolled into a tube during storage or transport. FIG. 3B shows a roll of metal foil 307 rolling out flatly and laminating on to the metal layer 305 at the back of the wafer. It is well known in the art that, the lead frame cannot be laminated to the back of the wafer 300 because of its hardness and thickness. As such, in the conventional packaging process, each single chip needs to be separated from the wafer before being placed one by one onto the lead frame. The process of present invention uses a metal foil instead of the lead frame. The metal foil layer 307 can be an economical material such as copper foil.

In an alternative embodiment, a metal coating with better electrical conductivity, such as gold, silver and the like, may be plated on the metal foil layer 307 at the side that is directly attached to the back of the wafer to enhance the attachment between the conductive adhesive layer 306 and the metal foil layer (not shown). The metal coating can be plated onto the metal foil layer 307 in various ways, for example electroplating, chemical plating, sputtering deposition and other methods, on the side of the metal foil 307 that is in contact with the conductive adhesive layer 306 and is laminated to the back of wafer 300. In some embodiments, during the step of laminating the metal foil layer 307 onto the back of the wafer, heat is applied to wafer 300 from the molding layer 206 at the front of the wafer and then is transmitted to the conductive adhesive layer 306. If the conductive adhesive layer 306 is a conductive paste or the like, when it is heated to a molten state, it can improve the effect of bonding between the back of wafer 300 and the metal foil layer 307, so that the metal foil layer 307 is more robustly and closely laminated to the wafer 300. At the same time, pressure can be applied uniformly over the entire bonding area of the metal foil layer 307 so that the metal foil layer 307 is locally subjected to uniform force, hence the metal foil layer 307 can be pressed closer to the back of the wafer. During this heating step, the flat top surface of metal bumps 205 are exposed from the top of the molding layer 206, as shown in FIG. 3B. The melting point of the metal bump 205 is required to be higher than the melting point of the conductive adhesive layer 306 to prevent the metal bumps 205 from melting.

Figure 3C:
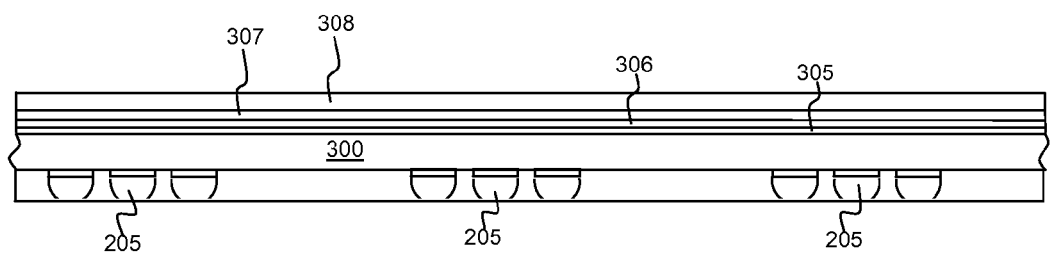
Figure 3D:
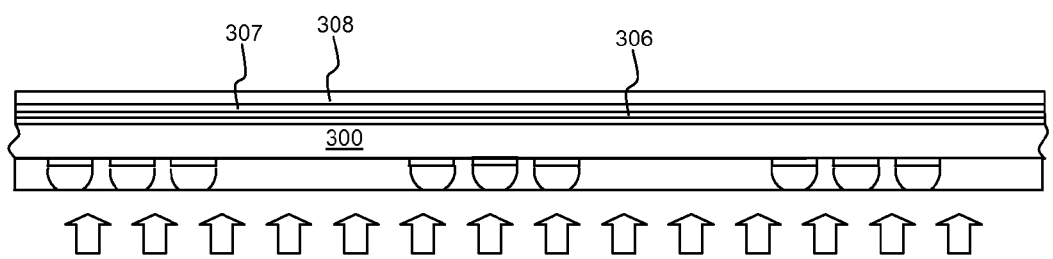

In FIG. 3C, a composite tape 308 is then placed atop the metal foil layer 307, which can be a simple paste bonding, or external pressure applied simultaneously on the composite tape 308 to reinforce the adhesion. Composite tape 308 may include at least one adhesive layer and a protective film layer (preferably black). The adhesive layer is firmly bonded to the surface of the metal foil layer 307 and the protective film layer, in addition to the physical protection of the wafer or chip, is also used for the subsequent marking step, which is described in detail later. An example of composite tape 308 is Japanese LC TAPE including an ordinary adhesive layer and a layer of polyimide PI as the protective film layer. Optionally, instead of heating the wafer 300 after the metal foil layer 307 is laminated to the back of the wafer, the wafer 300 is heated after the lamination of the composite tape 308 is completed, as shown in FIG. 3D. The adhesive layer of the composite tape 308 is heat curable, as such when heat is applied on the wafer, the adhesiveness of the composite tape 308 changes from temporary to permanent, while the conductive adhesive layer 306 is melted, producing a package structure with a better performance and lower cost. During the heating step, uniform pressure may also be applied over the entire region of the composite tape 308 and thus to the metal foil layer 307 to improve the contact between the metal foil layer 307 and the wafer 300.

The conventional method uses a plastic layer at the back of the wafer (for example, as shown in FIG. 1C, a plastic layer 123 is formed on the back of the chip), in which the plastic covering equipment is used and the ground plastic layer does not have very precise thickness, thus encounters various problems as described above. The method of present invention uses a composite tape 308 instead of a plastic layer, thus avoids the problems of the conventional method.

Figure 3E:
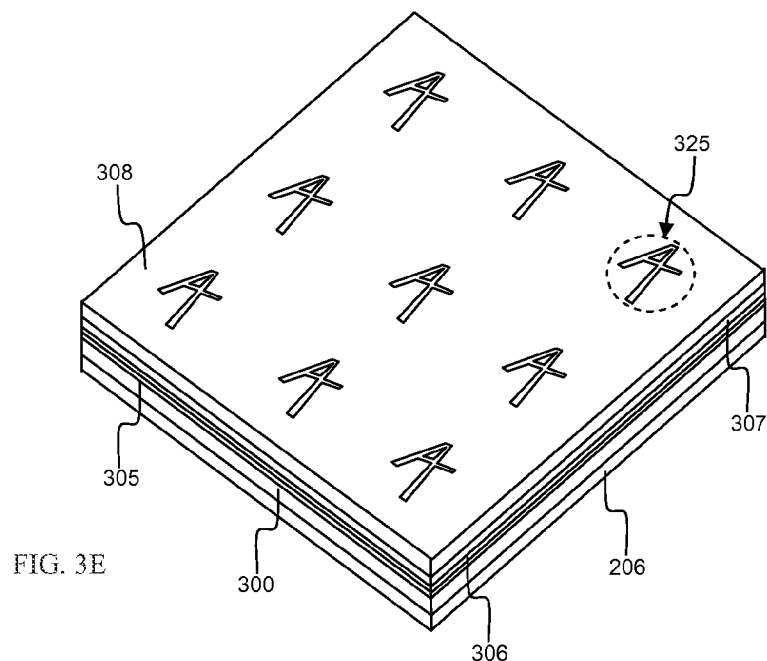
Figure 3F:
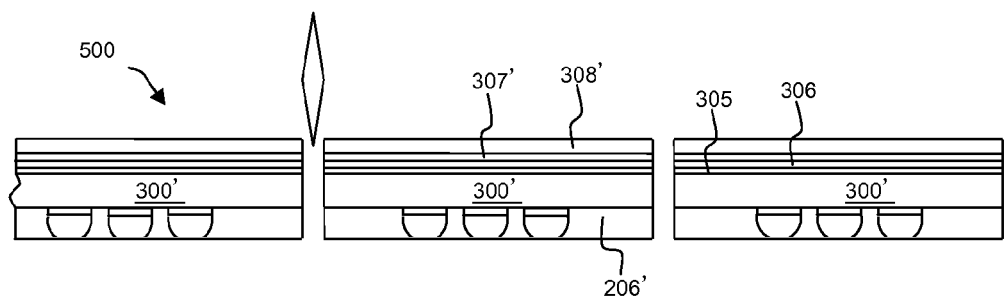
Figure 3G:
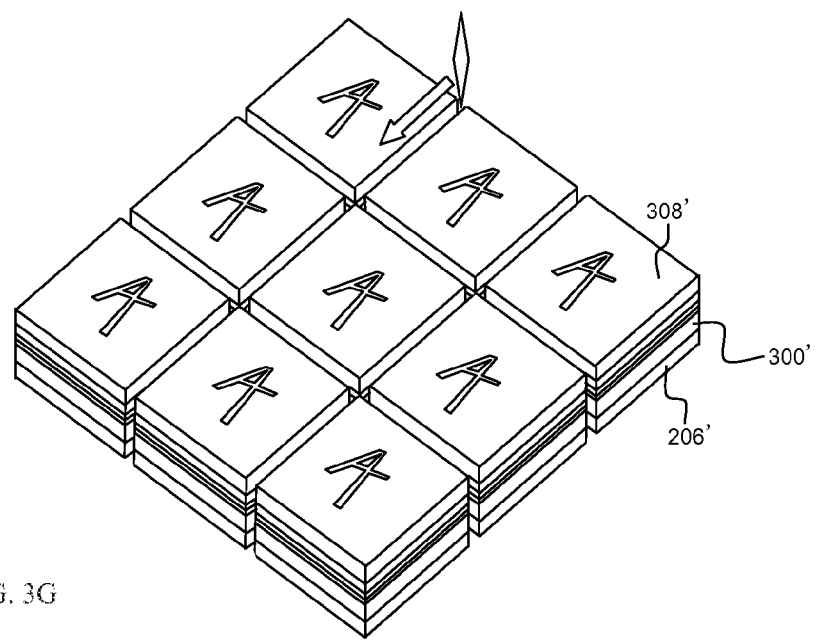

In FIG. 3E, a standard marking step is implemented. The marking can be made using direct coating printing. However, for a marking lasting longer, laser etching is applied forming the identification tag 325 on the protective film of composite tape 308 over each chip, such identification usually includes product information such as manufacturer, model, size, etc. The thickness of the composite tape 308 is predetermined, and as mentioned above, it is not a plastic covering layer, therefore a plastic forming step and the grinding step to reduce the thickness of the plastic layer are omitted avoiding the problems of the convention method as described above. In FIGS. 3F-3G, the individual power semiconductor devices 500 are separated by a standard sawing step along the scribe lines between adjacent chips 300' on wafer 300. Each individual package 500 includes a molding layer 206', a chip 300', and a metal layer 305, a conductive adhesive layer 306, a metal foil layer 307' and a composite tape 308', where the top molding layer 206' surrounds the metal bumps 205 formed on top of the pads 201 at the front of chip 300' with the flat top surface of each metal bump 205 exposed from the top surface of the molding layer 206', and an identification mark 305 formed on the composite tape layer 308'. The power semiconductor devices 500, although including a molding layer 206' on top of the front of chip 300', is a MCSP device without a molding layer at the back of the chip 300', but with a bottom composite tape layer 308' tightly bonded at the back of the chip 300'.

Figure 4A:
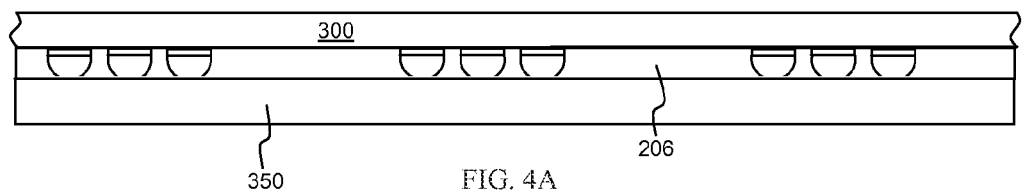
FIGS. 4A-4B are schematic diagrams illustrating a method of forming a MCSP power semiconductor device according to an alternative embodiment of the present invention.
Figure 4B:
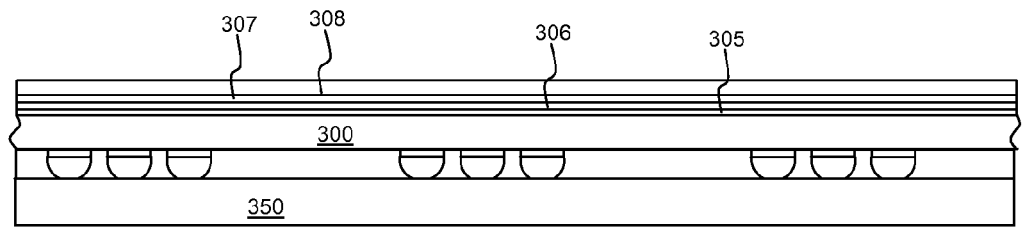

In an alternative embodiment, in the steps shown in FIG. 4A-4B, thinned wafer 300 is fragile and may be broken easily during transportation or at various stages of the packaging process, therefore an additional carrier substrate or a dummy wafer 350 is used for supporting the mechanical strength of the thinned wafer 300. As shown in FIG. 4A, before step of FIG. 3A, the dummy wafer 350 is formed at the front of the thinned wafer 300 attaching to the top of the ground molding layer 206. Then the steps according to FIGS. 3A-3G are followed, where a conductive adhesive layer 306, a metal foil layer 307, a composite tape 308 are sequentially formed to the back of wafer 300 as shown in FIG. 4B. Finally, the dummy wafer 350 is peeled off after the composite tape 308 is attached. Alternatively, dummy wafer 350 may be peeled off after the composite tape 308 is attached as shown in FIG. 3C, or after the heating step as shown in FIG. 3D, or even after the marking step of FIG. 3E, but generally before the sawing step in FIG. 3F. The dummy wafer 350 provides a mechanical strength for the wafer 300 during transportation and during the steps of laminating metal foil layers 307 and the composite tape 308 to the back of the wafer 300, as such eliminating the risk of breaking of the thinned wafer 300.

Figure 5A:
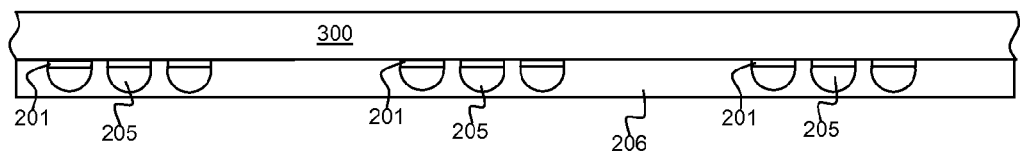
FIGS. 5A-5C are schematic diagrams illustrating a method of forming a MCSP power semiconductor device according to another alternative embodiment of the present invention.
Figure 5B:
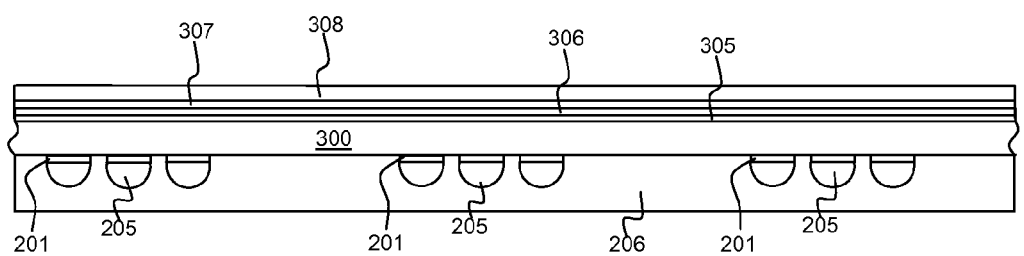
Figure 5C:
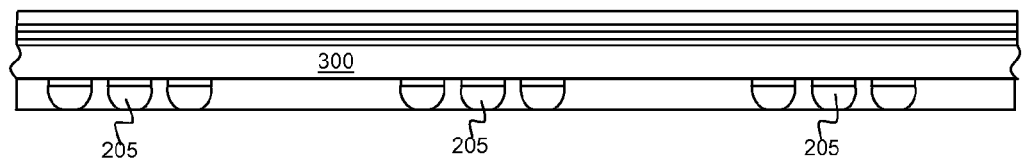

Another alternative embodiment is shown in FIG. 5A-5C, where the step of grinding the molding layer 206 as in FIG. 2E is skipped. The steps in FIGS. 3A-3G are applied directly after the step in FIG. 2D, that is, the original thickness of the molding layer 206 is retained until the composite tape 308 is attached to the back of the wafer. As shown in FIGS. 5A-5B, the original thickness of molding layer 206 is retained, and the steps of FIGS. 3A-3G are followed to attach a conductive adhesive layer 306, a metal foil layer 307 and a composite tape 308 in sequence to the back of the thinned wafer 300. In FIG. 5C, after the attachment of the composite tape 308 is finished, the molding layer 206 can be thinned by polishing, which may be done after the composite tape 308 is attached in FIG. 3C or after the heating step in FIG. 3D, or even after the marking step of FIG. 3E, but generally before the sawing step in FIG. 3F. In a preferred embodiment, if the thickness of the molding layer 206 is retained at steps in FIG. 3B or FIG. 3C, the metal bumps 205 are encapsulated in the molding layer 206 and are not exposed, then the melting points of the metal bumps 205 is not required to be higher than that of the conductive adhesive layer 306. In the embodiment of FIGS. 5A-5C, the original thickness of the molding layer 206 provides mechanical strength to the thinned wafer 300 thus eliminating the risk of breaking the thinned wafer 300.

Figure 6A:
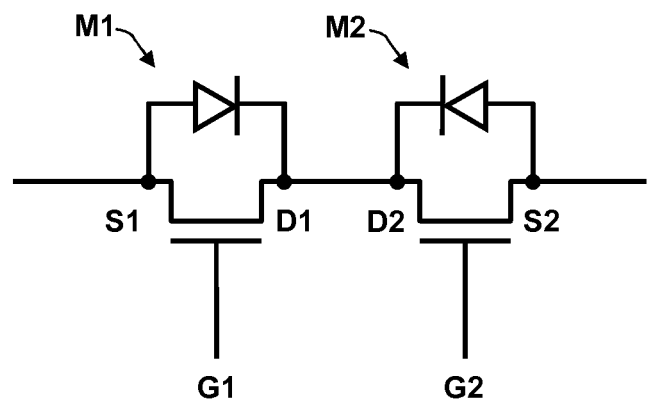
FIGS. 6A-6B are schematic diagrams illustrating the MCSP device of the present invention applied in a common drain dual MOSFET device.
Figure 6B:
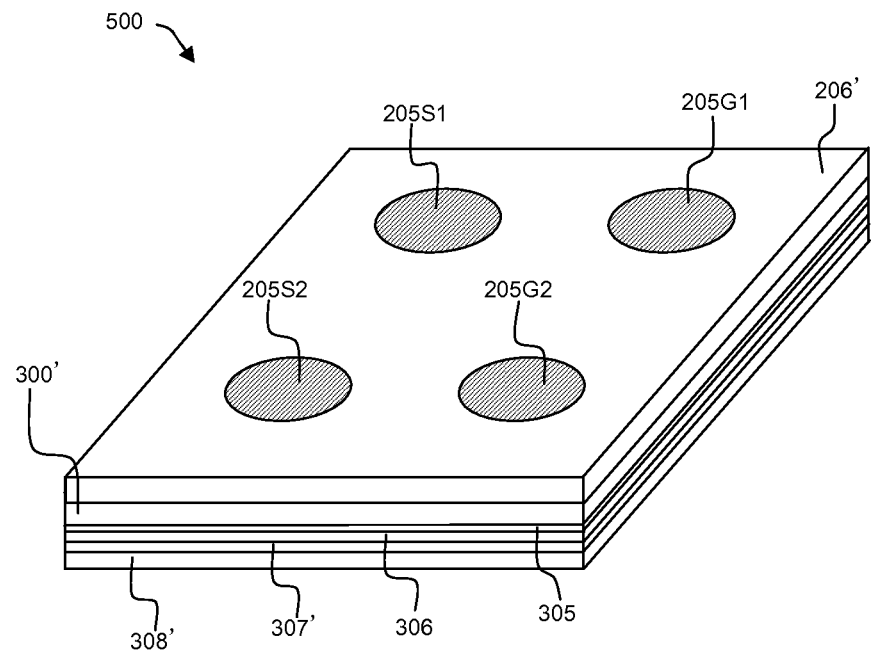

FIG. 6B is a perspective view of a MCSP power semiconductor device 500 that is flipped from FIG. 3G so that the marking tags 325 are facing downward. The MCSP device as shown in FIG. 6B may be applied for common drain dual MOSFETs device that are widely used in the battery charge-discharge circuit, where the integrated chip 300' contains two power MOSFETs M1, M2 connected together in a circuit as shown in FIG. 6A, where the drain D1 of MOSFET M1 is connected to the drain D2 of MOSFET M2 and the gate G1 of MOSFET M1 and gate G2 of MOSFET M2, which are controlled by the power management circuit. In the conventional package, the metal layer 305 at the back of the wafer is thin and thus cannot effectively reduce the resistance of MOSFETs M1, M2 connected in series or Rss (the resistance from the source S1 to S2). In the MCSP device 500 of the present invention, a shown in FIG. 6B, the metal foil layer 307' at the back of chip 300' functions as a common drain electrodes D1, D2 of the MOSFETs M1 and M2. In the MCSP device 500, metal bump 205S1 is in electrical contact with the conductive pad 201 connected to a source of the MOSFET M1 and metal bump 205G1 is in electrical contact with the conductive pad 201 connected to a gate of the MOSFET M1. Similarly, metal bump 205S2 is in electrical contact with the conductive pad 201 connected to the source of the MOSFET M2 and metal bump 205G2 is in electrical contact with the conductive pad 201 connected to a gate of the MOSFET M2. The top molding layer 206' covers the front of chip 300' and surrounds the metal bump 205S1, 205S2, 205G1, 205G2 with the top flat surface of each of the metal bumps are exposed from the top surface of the molding layer 206'. A conductive adhesive layer 306 is used to attach the metal foil 307' to the back of the chip 300' and the bottom composite adhesive layer 308' is laminated on the metal foil layer 307'. Optionally, a precious metal layer is plated on the metal foil layer 307' at the side attaching to the back of the chip 300'.

Figure 7A:
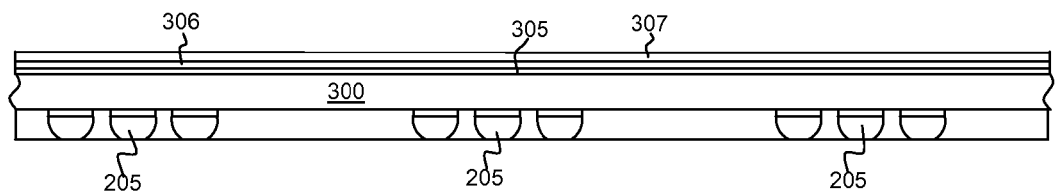
FIGS. 7A-7C are schematic diagrams illustrating the application of a LC Tape on the back of the wafer.
Figure 7B:
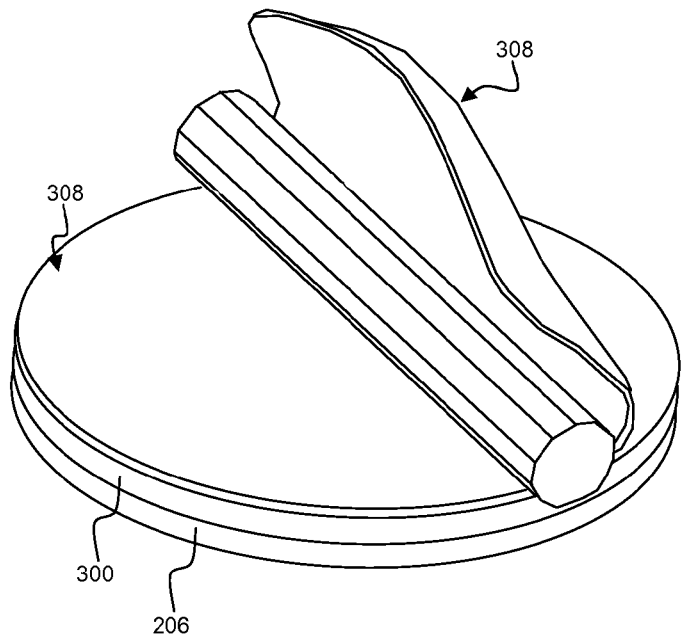
Figure 7C:
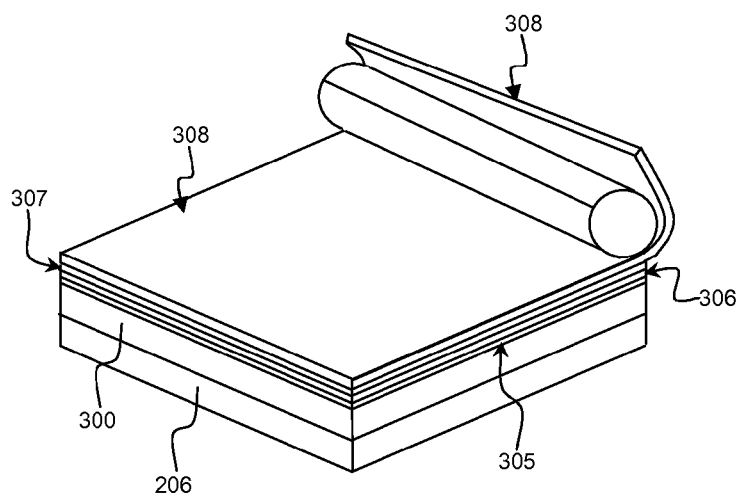

In an alternative embodiment, FIGS. 7A-7C illustrate the lamination of a coating tape (LC TAPE) or the composite tape 308 on the back surface of the wafer 300. FIG. 7A is similar to FIG. 3A as described above, in which a conductive adhesive layer 306 is deposited onto metal layer 305 on the back of the thinned wafer 300 and then the metal foil layer 307 is laminated onto the metal layer 305 through the conductive adhesive layer 306. FIG. 7B illustrates the lamination of the LC TAPE 308 onto the metal foil layer 307 at the back of the wafer 300 and FIG. 7C illustrates a portion of wafer 300 in FIG. 7B. The device is completed with the subsequent steps same as that in FIGS. 3C-3G.

LC TAPE may include thermosetting composition, the binder polymer composition, the energy-ray curable composition and the like. For example, Lintec Corporation of Japan includes the thermosetting composition such as epoxy resins, phenolic resins, melamine resins, urea resins, polyester resins, polyurethane resins, acrylic resin, urethane resin, polyimide, benzoxazine resins, and mixtures thereof. The binder polymer composition provides proper viscosity of the composite tape. Example of binder polymer includes acrylic polymer, polyester resin, polyurethane resin, silicone resin, and rubber polymers, preferably the acrylic polymer. Energy ray-curable composition comprises compounds that are polymerized/cured by radiation-energy ray such as ultraviolet and electron beam. Further, the composite tape may be colored by adding pigments or dyes, where a black composite tape may improve the final appearance of the chip.

Figure 8A:
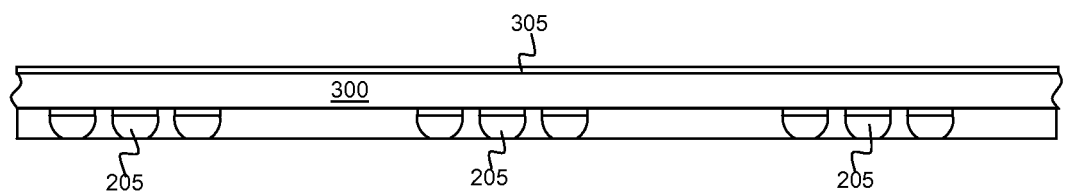
FIGS. 8A-8C are schematic diagrams illustrating the application of a tin (Sn) layer as an adhesive layer for attaching the meal foil layer on the back of the wafer.
Figure 8B:
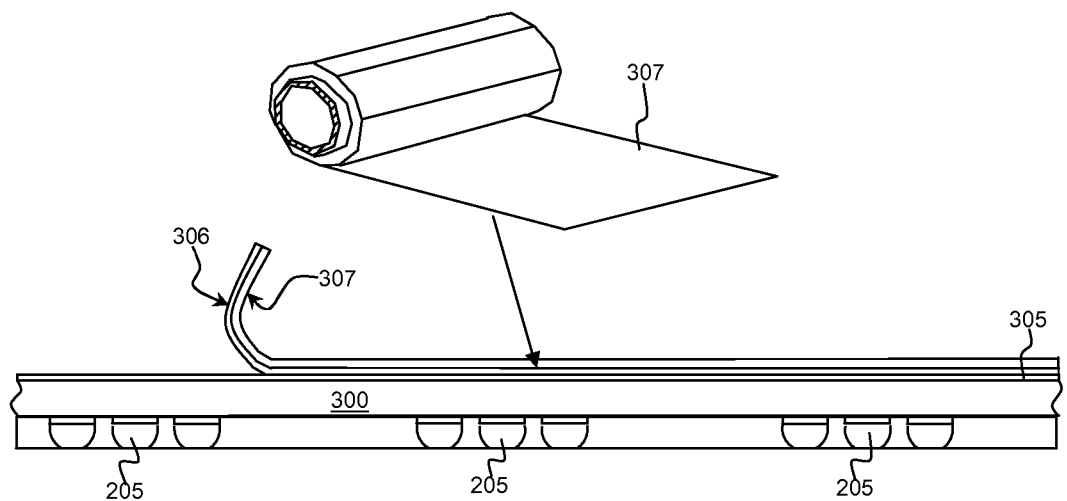
Figure 8C:
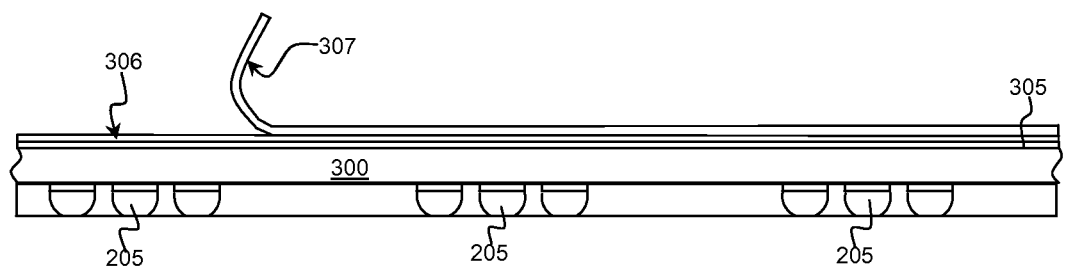

In an alternative embodiment shown in FIGS. 8A-8C, the material and the lamination of the conductive adhesive layer 306 is slightly changed. FIG. 8A is similar to FIG. 3A without conductive adhesive layer 306. In this embodiment, as shown in FIG. 8B, before the metal foil layer 307 is attached onto the metal layer 305 at the back of the wafer 300, a tin (Sn) layer is first plated onto the surface of the metal foil layer 307 at the side that will be attached to the back surface of the wafer, where the plated tin layer is used as the conductive adhesive layer 306. If the bonding surface of the metal foil layer 307 is coated with Ag or Au or some other precious metal first, then the tin layer is plated on top of the precious metal layer. As the tin layer has a better bonding effect in the laminating step, it is only requires a force of about 100 to 2500 grams force (gf) applied onto the metal foil layer 307 at about 200 to 400 degrees Celsius ambient temperature to laminate the metal foil layer 307 with the plated tin layer onto the metal layer 305 at the back of the wafer. Alternatively, as shown in FIG. 8C, when a tin (Sn) layer is plated directly onto the metal layer 305 at the back of the wafer instead on the surface of the metal foil layer 307, the metal foil layer 307 is laminated to the back of the wafer through the tin layer as a conductive adhesive layer 306.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

The invention claimed is:

1. A process for preparing a power semiconductor device comprising:
    providing a wafer having a front surface and a back surface opposite the front surface;
    providing a molding layer on the front surface of the wafer;
    coating a precious metal layer on a front surface of a metal foil layer;
    laminating the front surface of the metal foil layer to the back surface of the wafer using a conductive adhesive layer for bonding;
    attaching a composite tape on a back surface of the metal foil layer; and
    cutting along scribe lines between adjacent semiconductor chips, wherein the molding layer, the wafer, the conductive adhesive layer, the metal foil layer and the composite tape are cut through to separate individual power semiconductor devices.

2. The method of claim 1, further comprising the step of marking identification tags on the composite tape before cutting along scribe lines between adjacent chips.

3. The method of claim 1, further comprising applying heat to the wafer and simultaneously applying pressure to the metal foil layer during the process of laminating the metal foil layer to the back surface of the wafer, or applying heat to the wafer and simultaneously applying pressure to the composite layer and the metal foil layer after the composite tape is attached to the metal foil layer.

4. The method of claim 1, further comprising attaching a dummy wafer onto a top surface of the molding layer, applying the conductive adhesive layer onto the back surface of the wafer, and removing the dummy wafer after attaching the composite tape onto the metal foil layer.

5. A process for preparing a power semiconductor device comprising:
   providing a wafer having a front surface and a back surface opposite the front surface;
   providing a plurality of metal bumps and a plurality of corresponding conductive pads, each metal bump is disposed on a corresponding conductive pad, the corresponding conductive pads are disposed on a surface of a semiconductor chip formed on the front surface of the wafer;
   forming a molding layer on the front surface of the wafer whereby encapsulating the front surface of the semiconductor chip and the metal bump with a flat top surface of the metal bump is exposed from a top surface of the molding layer;
   laminating a front surface of a metal foil layer to the back surface of the wafer using a conductive adhesive layer for bonding;
   attaching a composite tape on a back surface of the metal foil layer;
   after attaching the composite tape on the metal foil layer, grinding a top surface of the molding layer to reduce its thickness until the top of the metal bump is flat and exposed from a top surface of the molding layer;
   cutting along scribe lines between adjacent semiconductor chips, wherein the molding layer, the wafer, the conductive adhesive layer, the metal foil layer and the composite tape are cut through to separate individual power semiconductor devices.

6. A power semiconductor device comprising:
   a semiconductor chip comprising a common drain dual metal oxide semiconductor field effect transistor (MOSFET);
   a plurality of metal bumps and a plurality of corresponding conductive pads, each metal bump is disposed on a corresponding conductive pad, the corresponding conductive pads are disposed on a front surface of the semiconductor chip;
   a molding layer provided on the front surface of the semiconductor chip and the metal bump, the molding layer surrounds the metal bump with the flat top surface of the metal bump exposed from a top surface of the molding layer;
   a metal foil layer laminated to a back surface of the semiconductor chip using a conductive adhesive layer, wherein the metal foil layer functions as the common drain electrode of the dual MOSFET and each metal bump is in contact with a corresponding gate or source of the dual MOSFET via the corresponding conductive pad; and
   a composite tape attached to a back surface of the metal foil layer.

7. The power semiconductor device of claim 6, wherein the metal foil layer has a thickness of about 0.5 to about 3 mil.

8. A power semiconductor device comprising:
   a semiconductor chip;
   a plurality of metal bumps and a plurality of corresponding conductive pads, each metal bump is disposed on a corresponding conductive pad, the corresponding conductive pads are disposed on a front surface of the semiconductor chip;
   a molding layer provided on the front surface of the semiconductor chip and the metal bump, the molding layer surrounds the metal bump with the flat top surface of the metal bump exposed from a top surface of the molding layer;
   a metal foil layer, having a precious metal coat applied onto a front surface of the metal foil layer, laminated to a back surface of the semiconductor chip using a conductive adhesive layer with the; and
   a composite tape attached to a back surface of the metal foil layer.

9. The power semiconductor device of claim 8, wherein the metal foil layer is provided with a thickness of about 0.5 to about 3 mil.

10. The method of claim 5 further comprising the step of marking identification tags on the composite tape before cutting along scribe lines between adjacent chips.

11. The method of claim 5, further comprising applying heat to the wafer and simultaneously applying pressure to the metal foil layer during the process of laminating the metal foil layer to the back surface of the wafer, or applying heat to the wafer and simultaneously applying pressure to the composite layer and the metal foil layer after the composite tape is attached to the metal foil layer.

12. The method of claim 5, further comprising applying a precious metal coat onto the front surface of the metal foil layer.

13. The method of claim 5, further comprising attaching a dummy wafer onto the top surface of the molding layer, applying the conductive adhesive layer onto the back surface of the wafer, and removing the dummy wafer after attaching the composite tape onto the metal foil layer.

* * * * *